United States Patent [19]

Randazzo

[11] 4,056,778
[45] Nov. 1, 1977

[54] DIGITAL TACHOMETER

[75] Inventor: Gaspare Randazzo, Turin, Italy

[73] Assignee: Societa di Elettronica per l'Automazione - SEPA S.p.A., Turin, Italy

[21] Appl. No.: 722,462

[22] Filed: Sept. 13, 1976

[30] Foreign Application Priority Data

Sept. 23, 1975 Italy .................................. 69357/75

[51] Int. Cl.² .............................................. G01P 3/48
[52] U.S. Cl. .............................. 324/166; 235/92 FQ; 235/92 CA; 235/92 CC
[58] Field of Search .............................. 324/166, 187; 235/92 FQ, 92 CA, 92 CC

[56] References Cited

U.S. PATENT DOCUMENTS

| 3,603,769 | 9/1971 | Malcolm | 235/92 FQ |
| 3,611,134 | 10/1971 | McDowell | 324/187 |
| 3,617,715 | 11/1971 | Dummermuth | 324/166 X |
| 3,753,111 | 8/1973 | Denbnovetsky et al. | 324/187 |
| 3,840,174 | 10/1974 | Craft | 235/92 CC |
| 3,863,153 | 1/1975 | Eshraghian | 324/166 |
| 3,906,346 | 9/1975 | Hunter | 235/92 CA X |

Primary Examiner—Rudolph V. Rolinec
Assistant Examiner—Vincent J. Sunderdick
Attorney, Agent, or Firm—Sughrue, Rothwell, Mion, Zinn and Macpeak

[57] ABSTRACT

A digital tachometer which can operate to count the revolutions of any rotating device for which an electrical signal the frequency of which is related to the speed of rotation can be obtained is disclosed. The tachometer includes means for 'normalizing' the input signal to provide a pulsed signal having a predetermined relationship with the speed of rotation, main counting means for counting the pulses, and means for displaying the accumulated count. The counters are controlled by logic circuits to count for a predetermined counting interval and the digital display is updated at the end of each counting interval. In addition to the main counting means there are provided interpolation means for generating a signal representing the number of revolutions performed by the device under test in the interval between each successive pulse of the "normalized" signal, to improve the accuracy of the tachometer. Further logic circuits are provided for controlling the main counters and the display to operate as an elapsed time chronometer.

8 Claims, 1 Drawing Figure

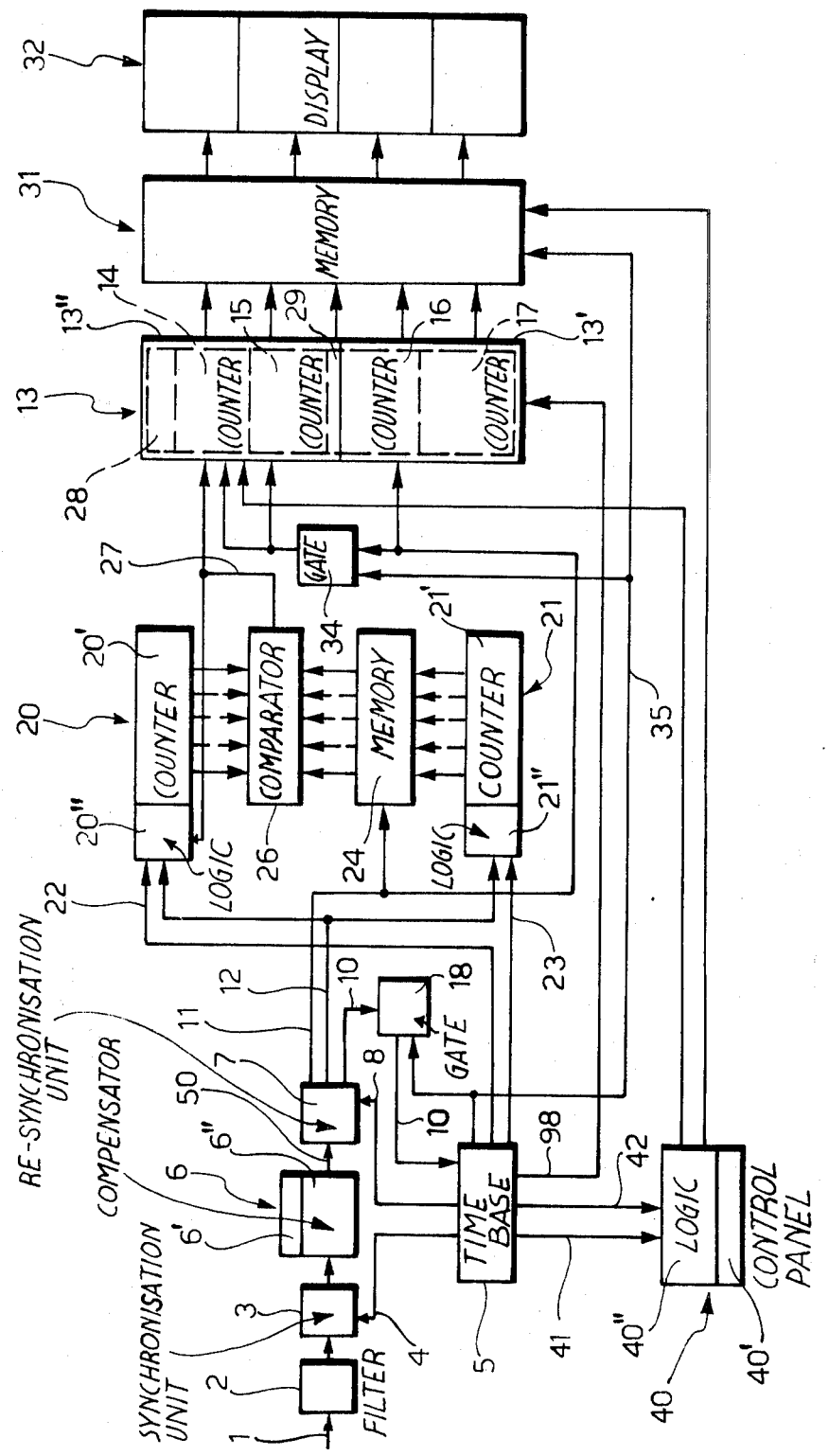

DIGITAL TACHOMETER

The present invention relates to a digital tachometer, that is a tachometer with a digital display of the information. In particular the invention relates to a tachometer which can measure accurately the speed of rotation, subject to the selection of a suitable scale factor, of any rotating device, providing it is possible to derive a synchronous electrical signal representing a fraction of a revolution, a whole revolution, or a predetermined number of revolutions. Tachometers formed as embodiments of the present invention are particularly useful for the accurate measurement of the speed of rotation of internal combustion engines since they do not require any transducer to be fitted to the engine itself.

Embodiments of the present invention can, therefore, be used for tachometric measurements on vehicles in motion, on the production line, or in test rooms and repair workshops. Known tachometers for accurate work, used at present, are generally very costly and even so are not really sufficiently accurate.

The object of the present invention is thus to provide an instrument for measuring the speed of rotation of a rotating device, which can provide a digital readout and which has great accuracy due to rapid updating of the digital readout information as the speed of rotation of the rotating device changes. Embodiments of the present invention can be manufactured relatively cheaply, are compact so as to be very easy to handle, easily connected to the signal and supply sources (normally the on-board battery of the motor vehicle), and which performs reliably in particularly severe environmental conditions such as, for example, those to which it would be subject in a moving vehicle arising from vibrations, acceleration and deceleration forces, temperature changes and electrical noise.

According to the present invention, there is provided a digital tachometer for determining and displaying the speed of rotation of a rotating device by counting pulses derived from an electrical signal produced by means sensitive to the speed of rotation of the device the frequency of which sensor signal is a function of the speed of rotation of the device, characterised by the fact that it comprises means for deriving from the said sensor signal, a first electrical signal, comprising a train of pulses the pulse repetition frequency of which is variable and directly related to the instantaneous frequency of the said sensor signal by a predetermined scale factor, counting means fed with the said first signal, processing means fed with the said first signal and operable to produce a second signal in the form of a train of pulses the frequency of which is related to the said first signal in such a way that in any interval between two successive pulses of the said first signal the frequency of the second signal is that frequency at which a predetermined given number of pulses would occur in the immediately preceding interval between two successive pulses of the first signal, interpolation means fed with the said second signal and operative to count the pulses thereof, a time base circuit which generates a signal controlling the operation of the said counting means such that these count the pulses of the said first signal only during successive counting intervals each of predetermined duration, memory means which are fed with a signal representing the content of the counting means accumulated during the last complete counting interval together with the content of the interpolation means accumulated between the last pulse of the said first signal and the end of the counting interval, and display means for displaying the content of the said memory means.

Embodiments of the present invention may also be provided with means for providing a chronometer type readout of elapsed time, making it possible to use the tachometer alternatively as a stopclock.

One embodiment of the present invention will now be more particularly described, by way of example, with reference to the accompanying drawing which is a block schematic diagram.

Referring now to the drawing, there is shown an input line 1 on which is fed an input signal to an input unit 2. The input signal may be derived in any known way providing it has a frequency proportional to the speed of rotation it is required to measure. An electrical signal representing the speed of rotation of an internal combustion engine can be derived simply and directly, by connecting the lead 1 to the contact breaker of the coil ignition: alternatively the signal can be obtained from a detector such as a coil of wire wound around a spark-plug lead. Other known means, such as electric, magnetic or electromagnetic detectors may be used, to obtain a periodic input signal on the input lead 1, with a frequency proportional to the speed of rotation it is desired to measure. Where the speed of rotation of an internal combustion engine is detected by sensing the electrical surge voltages at the contact breaker or in a spark plug high tension lead, due allowance must be made for the relationship between the frequency of the signal and the speed of rotation of the engine as will be discussed below.

The input circuit 2 largely comprises an RLC filter. An input signal on the line 1 taken from the contact breaker of the coil ignition typically reaches a high voltage peak of about 400 volts, which occurs at the opening of the contact, and thereafter falls to the battery voltage, which is usually about 12 volts. The input circuit 2 includes a Zener diode at the output of the RLC filter for the protection of the inputs of a trigger circuit which allows the use of TTL logic circuits for the various subsequent component blocks of the circuit.

The output of the input circuit 2 is fed to a synchronization unit 3, which is also fed by a high frequency signal on a line 4, from a time base unit 5. The unit 3, which may be constituted, for example, by multivibrators incorporating JK bistable circuits, to which the high frequency signal on the line 4 is fed as a clock signal, operates to synchronize the input signal on the line 1 with the internal time base of the unit 5, and, therefore, with the signals derived from it which will be discussed below. The time base unit 5 comprises a highly stable oscillator, suitably of the quartz type, and a plurality of counting decades which, by means of known output circuits, provides various output signals of different frequencies.

The output signal from the synchronization unit 3 is fed to a unit 6 which compensates for the relation between the frequency of the signal and the actual number of revolutions per unit time of the rotating device being measured. In the example given above of a four cylinder internal combustion engine where the input signal is derived from the contact breaker, the frequency of the input signal will be twice the speed of rotation if the engine operates on a four stroke cycle, whereas if the signal is derived from a spark plug lead then the frequency of the signal will be half the speed of rotation;

for a six cylinder engine, there will be a different relationship between the frequencies of signals derived in this way and the number of revolutions per unit time of the engine being measured. The compensation unit 6 comprises a part, indicated 6" comprising the logic components, and a part 6' comprising a control panel having an array of push buttons for selecting what proportion of the input signal is to be passed to the output of the compensation unit 6. Thus, for example, if a push button marked "one cylinder" is depressed, the unit 6 produces the input signal frequency at its ouput, whereas if another button, for example one marked "two cylinders" is depressed, the output signal from the compensation unit is half the frequency of the input signal. This ensures that the relationship between the signal 50 at the output of the compensator 6 and the actual rotation of the engine being measured is one pulse every two revolutions. An appropriate number of push buttons is provided so that by suitable selection it is possible to compensate for the relationship between the frequency of the input signal and the actual number of revolutions per unit time of the engine so that whatever system is used for deriving the sensor signal a "normalised" output signal from the unit 6 of two pulses per revolution can be provided by depressing the appropriate push button on the control panel.

Thus, for example, if a sensor providing a signal the frequency of which is effectively one cycle per revolution of the engine an appropriate setting on the compensation unit 6 will provide an output the frequency of which is half the input signal so that one pulse every two revolutions is provided at the output of the compensation unit 6.

The output of the compensation unit 6 is fed to a synchronization and delay unit 7, which is also fed with a high frequency signal on the line 8, from the time base unit 5. The signal on the line 8 may, conveniently, be identical to the signal fed on the line 4 from the time base unit 5 to the synchronisation unit 3. The unit 7, which may also incorporate multivibrators in the form of "JK" bistable circuits, which receive the high frequency signal on the line 8 as a clock signal, operates to re-synchronise the output signal of the compensation unit 6 and to generate from this signal three periodic output signals on lines 10, 11 and 12, suitably delayed with respect to one another. Hereinafter the signals fed along particular lines of the system will be indicated, for convenience, simply by the reference numeral representing that line. Thus, for example, the signal appearing from time to time, on the line 10 will be referred to as the signal 10.

The periodic signal 10 is taken to a logic gate 18.

The periodic signal 11 is fed to a main counter 13 which comprises an array of counting decades 14, 15, 16, 17 constituting a counting unit 13' and an interpolation unit 13" as will be described in greater detail below. The counting decades 14, 15, 16, 17 count signals representing units, tens, hundreds and thousands of revolutions respectively. The signal 11 fed to the counting unit 13' is, in this example, connected to the input of the counting decade 16 which counts the hundreds, for reasons which will become apparent from the following description.

The periodic signal 12 which is delayed with respect to the signals 10 and 11, is fed to two subsidiary counting units 20 and 21, each of which comprises a number of decade counting circuits 20', 21' respectively and logic control circuits 20", 21" respectively. The signal 12 is fed to the logic control circuits 20", 21" and serves to control the setting to zero of the counting decades 20' and 21'.

The logic control circuits 20" and 21" are also fed with two high frequency signals 22 and 23 respectively, which are outputs from the time base unit 5, and which determine the counting frequency of the respective counting units 20' and 21'. The frequency of the signal 22 is greater than that of the signal 23 and their ratio is fixed as will be described below.

The periodic signal 11 is fed to the clock input of a latching memory 24 the inputs of which are connected to the outputs of the decade counting circuits 21'. The periodic signal 11 thus controls the transfer of the output signals of the secondary counter 21 into the memory 24.

The outputs of the memory 24 are fed to a comparator 26, which also receives inputs from the subsidiary counting unit 20. The comparator 26 generates an output signal 27 each time the input signals received from the subsidiary counting unit 20 are equal to the input signals received from the memory 24. This output signal 27 from the comparator 26 is fed to the counting decade 14 (which counts the units) of the interpolation unit 13" of the main counter 13. The output signal 27 from the comparator 26 is also fed to the control logic circuit 20" to control the resetting, that is the setting to zero of the counting decades 20'.

The interpolation unit 13" comprises the circuit 28 for stopping the counting of this interpolation unit 13", and a unit 29 which controls the feeding of the count accumulated in the interpolation unit 13" to the memory 31 when this exceeds the maximum counting figure thereof. The circuit 28 stops the counting of the interpolation unit 13" when it has reached its maximum counting figure, that is 99, and the unit 29, which comprises, for example, a bistable multivibrator, feeds an input signal to the "hundreds" stage of a latching memory 31, to which are also fed the "hundreds" output of the main counter unit 13. The outputs of the memory 31 are fed to a digital display device 32, which, in the example shown, is a four figure display.

The periodic signal 11 is also fed to a unit 34 which comprises logic circuits for controlling the operation of the interpolation unit 13". The unit 34 is also fed with a signal 35 from the time base unit 5; this signal 35 is generated after a predetermined time, depending on the scale factor selected, starting from the moment when the periodic signal 10 occurs. This initial moment is established by the gate 18 which passes the next input signal 10 fed thereto to the time base unit 5 after it has received the output signal 35 from the time base unit 5. The signals 10 and 35 thus determine the size of a counting interval or "window" during which the counter 13 counts the pulses on the line 11 which are derived from the input signal 1.

The time base unit 5 also generates a signal 98 which is delayed for a short time with respect to the signal 35, and which is fed to the main counter 13 to set it to zero. Likewise the logic gate 34 operates in such a way as to return the interpolation unit 13" to zero at each pulse of the periodic signal 11; the unit 13" then counts until the occurrence of the next pulse of the signal 35 which stops the counting of the interpolation unit 13". The signal 35 is also fed to the memory 31 so that simultaneously with the stoppage of the counters of the interpolation unit 13" the contents of the main counters 13' and of the interpolation counters 13" are transferred into the memory 31.

The operation of the device described above as a digital tachometer is as follows:

It is conventional for tachometers to present the speed of rotation being measured in revolutions per minute (r.p.m.). However a digital tachometer could not operate by counting the revolutions occurring in a minute since by the time the information were ready for display it would be a minute out of date and the display would be useless. For this reason a digital tachometer must operate to count the revolutions detected for a short time interval, and the result multiplied by a scale factor determined by the ratio between the duration of the counting interval and the unit of time in which the result is to be expressed. The display can then be frequently updated, for example at intervals of the same order of magnitude as the length of the counting interval. However, since the counting interval, once determined, is a fixed time period, and since it is preferably very much shorter than the unit of time in which the result is to be expressed (for example 1/100th of the unit time), then the scale factor by which the result of counting the input signal pulses for the duration of the counting interval must be multiplied is quite large (i.e. of the order of 100 in the example given above).

However, it is obvious that the duration of the counting interval will not, except at certain speeds of rotation, contain an exact number of pulses to be counted, and the proportion of a pulse left uncounted, when multiplied by the scale factor would represent a quite considerable inaccuracy.

In order to eliminate or at least reduce this inaccuracy, the system described herein generates a subsidiary signal the frequency of which is an exact fraction (i.e. a whole number fraction) of the time interval between the immediately preceding two pulses of the input signal being counted, the magnitude of this fraction being such that the number of pulses counted in a time period equal to the said time interval is exactly equal to the scale factor. This subsidiary signal is counted in the interpolation unit 13".

At the end of a time interval between two consecutive pulses of the input signal being counted in the main counting unit 13', the interpolation unit 13" will have counted a number of pulses equal to the scale factor, provided the speed of rotation being measured is constant since only in this case will two consecutive such time intervals be of identical duration. Obviously if the speed of rotation being measured is increasing the time periods between successive pulses the input signal will be progressively decreasing so the interpolation unit will not reach a full count in each interval between two successive pulses of the input signal, and therefore in cases of acceleration and deceleration the interpolation unit 13" will obviously introduce errors due to the difference between the actual count which may be slightly greater or less than the scale factor which is the theoretical ideal. Although these inaccuracies in the count of the interpolation unit 13" are small they might become significant if their effect were cumulative, and in order to avoid the possibility of cumulative errors of the count in the interpolation unit 13" this count is only taken into consideration at the end of the time interval between the arrival of the last pulse of the input signal to be counted by the main counter 13', and the end of the counting interval. Consequently, any error in the information obtained from the operation of the interpolation unit 13" is very limited, even in the case of very rapid variations in the speed of rotation to be recorded.

For the purpose of illustrating the operation of the device described, above, it will be assumed that it is to be used to determine the speed of rotation of a four cylinder internal combustion engine and the input signal is to be derived from the contact breaker, and the speed of rotation of the engine is to be displayed in r.p.m.

Now, in a four stroke, four cylinder internal combustion engine the contact breaker opens once every half revolution of the engine; the contact breaker opens once for each cylinder and each cylinder is fired once every two revolutions. The signal derived from the contact breaker and appearing on the input line 1 will thus comprise two pulses per revolution of the engine.

By depression of the push-button of the compensation unit 6' marked "four cylinders" this unit will divide the input signal to produce an output signal which is one quarter the frequency of the input signal, that is to say, a signal comprising one pulse for every two revolutions of the engine, this being the standard relation on which the subsequent circuits are designed to work. In this example the duration of the counting interval is fixed at 0.6 seconds, that is to say, at 1/100 minutes and thus the scale factor by which it is necessary to multiply the number of pulses at the output of unit 6, counted in the duration of a counting interval, to obtain the speed of rotation of the engine in r.p.m., in 200.

The operation of the synchronisation circuit 3 is to synchronise the pulses of the input signal 1 with a reference signal produced by the time base unit 5 and to reduce the duration of each pulse to a standard length. If the signal 4 from the time base unit 5 has a frequency of 1 MHz the duration of the input signal pulses is reduced to 1 $\mu$sec.

At the output of the compensation unit 6 there will be a signal 50 comprising one pulse after every four pulses of the input signal 1. This signal 50 is then synchronised by the second synchronising unit 7 and, assuming that the signal 8 also has a frequency of 1 MHz the output of the unit 7 will be a signal 10 comprising pulses of 1 $\mu$sec. duration at the same frequency as the signal 50, followed by two further pulse signals 11, 12, the first delayed with respect to the pulses of the signal 10 by 1 $\mu$sec. and the second delayed with respect to the pulses of the signal 10 by 2 $\mu$sec.

The signal 11 is fed to the main counting unit 13' as the signal to be counted during the counting interval to determine the speed of rotation of the engine: this signal must, of course, be multiplied by the scale factor of 200 and this is simply achieved by feeding it directly to the appropriate input of the decade 16 of the main counting unit 13' which counts the "hundreds" in such a way that upon the reception of each pulse the main counting unit 13' experiences an incremental advance of 200.

The signal 10, which precedes the signal 11 by 1 $\mu$sec is fed to the logic gate 18 to cause the start of the counting interval which lasts for 0.6 seconds, this being determined by the time base circuit 5 which produces the output signal 35 0.6 seconds after the occurrence of the pulse 10 which starts the counting interval, thereby stopping the count in the main counter 13. During this counting interval the main counting unit 13' will have counted a number of pulses of the signal 11 representing the speed of rotation of the engine to the nearest 200 r.p.m. with an inaccuracy due to the time interval between the last pulse of the signal 10 counted and the termination of the counting interval. The value of this fractional interval is determined (within certain limits of accuracy) by the interpolation unit 13" in the following manner:

The pulses of the signal 12 are produced by the unit 7 1 μsec after the pulses of the signal 11 which are counted in the main counting unit 13'. These pulses of the signal 11 are fed to the locgic circuits 20" and 21" and act to reset to zero the subsidiary counters 20' and 21'. These counters 20', 21' are fed, via the logic circuits 20" and 21" with the signals 22, 23 respectively, these latter being produced by the time base unit 5. The ratio of the frequencies of the signals 22, 23 is equal to the scale factor, that is to say, two hundred. Conveniently, the frequency of the signal 23 is 10 KHz, and that of the signal 22 is 2 MHz. The signal 11, in addition to being fed to the main counting unit 13' is also fed to the clock input of the memory unit 24 which is fed with the output signal from the decade counting circuits 21' fed with the 10 KHz signal 23. The signal 11 controls the transfer of the contents the counting circuits 21' to the memory 24 which stores these signals, presenting them at its outputs, until the next pulse of the signal 11 occurs. The immediately following pulse of the signal 12, which is delayed by 1 μsec with respect to the signal 11, resets the counters 20', 21' and they immediately recommence counting the pulses of the two signals 22, 23 respectively. Meanwhile the memory 24 stores signals representing the count of the counter 21' in the immediately preceding time period between the occurrence of two successive pulses of the signal 11. The output of the memory 24, which represents the stored signal, is continuously compared in the comparator 26 with the output from the counter 20' which, because the signal 22 with which it is fed is a high frequency (2 MHz) is continuously circulated. The comparator 26 produces an output signal each time the counter 20' reaches a count equal to the signal stored in the memory 26, and, because the signal 22 counted by the counter 20' is two hundred times higher than the signal 23 counted in the counter 21' the comparator 26 will produce two hundred output pulses between one pulse of the signal 11 and the next if this interval is equal to that of the preceding interval, that is to say assuming the speed of rotation to be constant.

The output signal 27 from the comparator 26 therefore comprises 200 pulses between two subsequent signals 50 (from which the signals 11 are derived) in the case of constant speed. Therefore, this signal 27 increases the content of the interpolation unit 13" by 200 between each pulse of the signal 11. At the end of the interval between two signals 50, there is a new signal 11 which increases by two hundred the content of the main counting unit 13'; simultaneously, through the gate 34, the content of the interpolation unit 13" is reset to zero.

This is repeated for every pulse of the signal 50 until at the end of the counting interval of 0.6 seconds, the signal 35 is generated by the time base circuit 5. This signal, through the gate 34, stops the counting of the interpolation unit 13", and simultaneously transfers to the memory 31 the contents of the main counting unit 13' and of the interpolation unit 13", so that the total signal in the memory 31 includes a part which represents the number of revolutions of the device being measured during the interval between the arrival of the last signal 50 and the end of the counting interval.

The output of the memory 31 then feeds the digital display unit 32 for the duration of the next counting interval, until the arrival of a following signal 35. The information in the memory 31 is thus updated every 0.6 sec. which is a relatively short time, but which is long enough to allow reading of the display.

After the end of a counting interval of 0.6 seconds, it is necessary that the following counting interval should not commence immediately, but rather from the occurrence of the next signal 50. This is controlled by the gate 18, since the signal 35 which terminates a counting interval is also fed to the gate 18 to enable this gate to pass the next pulse of the signal 10. Thus, upon the occurrence of the next signal 10 a pulse (also indicated 10) is fed to the time base circuit 5 to start a new counting interval.

The operation described above provides strictly accurate information with regard to the speed of rotation being measured when this is constant; if instead, it is increasing or decreasing there will be a small error since in these cases two consecutive intervals between the signals 50 are not equal, so that the signal 27 comprises a number of pulses more or less than two hundred.

For example, in the case of acceleration the new comparison interval between two successive pulses 11 which determine successive changes in the content of the memory 24 will be shorter than the preceding one and, therefore, the outputs of the counter 20' will become equal to the outputs of the memory 24 a number of times fewer than two hundred in this new interval and thus the count in the interpolation unit 13" will always be a little less than the correct one. However, because the content of this unit is only taken into the account at the end of the counting interval, it will be appreciated that the effect of this error will be small.

In the case of deceleration, on the other hand, each new interval between two pulses will be greater than the last so that the number of pulses of the signal 27 fed to the interpolation unit 13" may exceed 199 before the next occurrence of a pulse 11 to clear the counters of the interpolation unit 13". In this case, the unit 28 stops the counting of the interpolation unit 13", and transfers the contents thereof to the memory 31, in case the unit 34 receives a signal 35 indicating the end of the counting interval before the subsequent signal 11. Even so the inaccuracy which this entails is very small, it can be shown that, at constant speed the information error is contained with ± 2 r.p.m., whereas even for very rapid speed variations of ± 1000 rpm/sec the error is only ± 20 rpm.

The device shown in the drawings also includes means permitting its use as a chronometer. This comprises a unit 40 which is fed from the time base unit 5 with two signals 41 and 42.

The unit 40 is constituted by a control unit 40' which includes control push-buttons, and by a logic unit 40" which operates as follows:

The control unit 40' includes a first and a second push button which permit the measurement of elapsed times for the purpose, for example, of measuring vehicle performance. The two signals 41, 42 may, for example, have frequencies of 10 Hz and 100 Hz so that elapsed time can be determined with an accuracy of ± 0.1 secs. or ± 0.01 secs. Of course, since there is only a single set of decade counters, if the higher frequency signal is used to obtain greater accuracy this limits the maximum time which can be measured. Thus, the display may register up to 999.9 seconds or 99.99 seconds as selected.

Depression of the aforementioned first push-button of the control unit 40' has the effect of resetting the counter 13 to zero, passing one of the signals 41 or 42 (as selected separately) to the counter 13 and also of providing a continuous display of the count by the effect of a signal fed to the clock input of the memory 31. Subsequent depression of the said first push-button, causes the display to be stopped, again by acting on the clock input of the memory 31.

The second push button serves to halt the display and immediately to reset the counter 13 to zero so that a number of consecutive time intervals can be measured by depressing the fisrt push button to commence the count and then depressing the second push button to stop the count at the total reached at the time, this reset the counter 13 to zero so that further actuation of the second push button provides a display of the count accumulated since the first (or, in the case of several actuations of the second push button, the immediately preceding) actuation thereof.

It will be appreciated that since there is only one set of counters and one display device the operation of the device as a tachometer, and its operation as a chronometer are mutually exculsive.

It will also be appreciated that different parameters from those described in relation to the specific embodiment illustrated can be used. For example, the counting interval, and thus the scale factor may be different and the main counter 13 may have a different number of counting decades.

What is claimed is:

1. A digital tachometer for determining and displaying the speed of rotation of a rotating device by counting pulses derived from an electrical sensor signal produced by a sensor sensitive to the speed of rotation of the device, the frequency of said sensor signal being a function of the speed of rotation of the device, comprisings:

means for deriving from said sensor signal a first electrical signal in the form of a train of pulses the pulse repetition frequency of which is variable and directly related by a predetermined scale factor to the instantaneous frequency of said sensor signal,
   main counting means,
   means feeding said first signal to said main counting means,
   processing means,
   means feeling said processing means with said first signal, said processing means operating to produce a second signal in the form of a train of pulses the frequency of which is related to said first signal is such a way that in any interval between two successive pulses of said first signal the frequency of said second signal is that frequency at which a predetermined given number of pulses equal to said scale factor would occur in the immediately preceding interval between two successive pulses of said first signal,
   interpolation means,
   means feeding said processing means with said first ond signal, said interpolation means operating to count the pulses of said second signal,
   a time base circuit which generates a signal controlling the operation of said main counting means whereby to define successive counting intervals during which said main counting means count the pulses of said first signal,
   memory means,
   means feeding said memory means with a signal representing the content of said main counting means accumulated during the last complete counting interval together with the content of said interpolation means accumulated between the last pulse of said first signal and the end of said counting interval, and
   display means operating to display the content of said memory means,
   said processing means comprising:
   first and second counters,
   means feeding said first and second counters with respective counting signal, the frequency of the signal fed to said first counter being greater than the frequency of the signal fed to said second counter by a factor equal to the said scale factor,
   a memory device,
   means feeding the output of said second counter to said memory device under the control of said first signal whereby the count accumulated in said second counter between two successive pulses of said first signal is stored in said memory device until the occurrence of the next pulse of said first signal, and
   comparator means operating to compare the contents of said memory device with the contents accumulated at any time in said first counter and to produce at the output thereof a pulse of said second signal each time the count of said first counter is the same as the count stored in said memory device.

2. A tachometer as in claim 1, wherein said first and second counters of said processing means such comprises a plurality of counting decades, and respective logic circuits to which are fed control signals at the same frequency as, but delayed with respect to, said first signal.

3. A tachometer as in claim 1 wherein said counting signals fed to said first and second counters of said processing means are produced by said time base circuit.

4. A digital tachometer for determining and displaying the speed of rotation of a rotating device by counting pulses derived from an electrical sensor signal produced by a sensor sensitive to the speed of rotation of the device, the frequency of said sensor signal being a function of the speed of rotation of the device, comprising:

means for deriving from said sensor signal a first electrical signal in the form of a train of pulses the pulse repetition frequency of which is variable and directly related by a predetermined scale factor to the instantaneous frequency of said sensor signal,
   main counting means,
   means feeding said first signal to said main counting means,
   processing means,
   means feeding said processing means with said first signal, said processing means operating to produce a second signal in the form of a train of pulses the frequency of which is related to said first signal in such a way that in any interval between two successive pulses of said first signal the frequency of said second signal is that frequency at which a predetermined given number of pulses equal to said scale factor would occur in the immediately preceding interval between two successive pulses of said first signal,
   interpolation means,
   means feeding said interpolation means with said second signal, said interpolation means operating to count the pulses of said second signal, a time base circuit which generates a signal controlling the operation of said main counting means whereby to define successive counting intervals during which said main counting means count the pulses of said first signal, memory means, means feeding said memory means with a signal representing the content of said main counting means accumulated during the last complete counting interval together with the content of said interpolation means accumulated between the last pulse of said first signal and the end of said counting interval, display means operating to display the content of said memory means, a logic control gate, means feeding said logic control gate with a control signal synchronized with said first signal but in advance thereof by a predetermined amount, and means feeding to said logic control gate said signal generated by said time base circuit which terminates said counting interval, said logic control gate acting to pass to said time base circuit a control signal to start the next counting interval upon the arrival of the subsequent said control signal.

5. A tachometer as in claim 4, wherein said interpolation means are also controlled by a further logic gate, means feeding said further logic gate with said first signal, means feeding said further logic gate with said signal generated by said time base circuit to terminate said counting intervals, said further logic gate acting in response to the arrival of said first signal to set the counters of said interpolation means to zero, and in response to the arrival of said signal generated by said time base circuit to terminate said counting intervals to transfer the contents of said counters of said interpolation means to said memory means.

6. A digital tachometer for determining and displaying the speed of rotation of a rotating device by counting pulses derived from an electrical sensor signal produced by a sensor sensitive to the speed of rotation of the device, the frequency of said sensor signal being a function of the speed of rotation of the device, comprising:

means for deriving from said sensor signal a first electrical signal in the form of a train of pulses the repetition frequency of which is variable and directly related by a predetermined scale factor to the instantaneous frequency of said sensor signal, main counting means, means feeding said first signal to said main counting means, processing means, means feeding said processing means with said first signal, said processing means operating to produce a second signal in the form of a train of pulses the frequency of which is related to said first signal in such a way that in any interval between two successive pulses of said first signal the frequency of said second signal is that frequency at which a predetermined given number of pulses equal to said scale factor would occur in the immediately preceding interval between two successive pulses of said first signal, interpolation means, means feeding said interpolation means with said second signal, said interpolation means operating to count the pulses of said second signal, a time base circuit which generates a signal controlling the operation of said main counting means whereby to define successive counting intervals during which said main counting means count the pulses of said first signal, memory means, means feeding said memory means with a signal representing the content of said main counting means accumulated during the last complete counting interval together with the content of said interpolation means accumulated between the last pulse of said first signal and the end of said counting interval, display means operating to display the content of said memory means, means for presenting on said display means a display of elapsed time, said means comprising:

a chronometer logic circuit, and means feeding said chronometer logic circuit with a least one constant frequency signal from said time base circuit, said chronometer logic circuit having outputs connected to said main counting means and to said memory means and operating to feed said constant frequency signal to said main counting means and a control signal to control said memory means is continually updated with the information in said counting means and transfer this information immediately to said display means.

7. A tachometer as in claim 6, wherein said chronometer logic circuit also includes means for selectively controlling said memory means so that further transfer of information from said main counting means can be stopped whereby the count stored in said memory means represents the elapsed time between the commencement of counting and the stopping of the transfer from said main counting means.

8. A tachometer as in claim 7, wherein said chronometer logic circuit includes:

means for selectively controlling further subsequent transfer of the count accumulated in said main counter to said memory means whereby to obtain successive displays of successive periods of elapsed time.

* * * * *